US 6,711,020 B2

(12) United States Patent
Yu et al.

(10) Patent No.: US 6,711,020 B2
(45) Date of Patent: Mar. 23, 2004

(54) HEAT DISSIPATION APPARATUS AND ELECTRIC APPLIANCE USING THE SAME

(75) Inventors: Wen-Lung Yu, Taoyuan Hsien (TW); Yang-Cheng Chang, Taoyuan Hsien (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 0 days.

(21) Appl. No.: 10/247,181

(22) Filed: Sep. 18, 2002

(65) Prior Publication Data

US 2004/0037040 A1 Feb. 26, 2004

(30) Foreign Application Priority Data

Aug. 21, 2002 (TW) ....................................... 91212992 U

(51) Int. Cl.[7] .................................................. H05K 7/20
(52) U.S. Cl. ........................................ 361/719; 257/719
(58) Field of Search ........................ 174/16.3; 165/80.3, 165/185; 257/706, 707, 713, 718, 719, 726, 727; 361/703–705, 709–712, 715, 720, 717–719

(56) References Cited

U.S. PATENT DOCUMENTS

| 3,859,570 | A | * | 1/1975 | Veranth et al. ............. 361/717 |
| 5,621,615 | A | * | 4/1997 | Dawson et al. ............. 361/704 |
| 5,838,064 | A | * | 11/1998 | Shimada et al. ............ 257/718 |
| 5,901,039 | A | * | 5/1999 | Dehaine et al. ............. 361/704 |
| 6,067,230 | A | * | 5/2000 | Ashida et al. .............. 361/704 |

* cited by examiner

Primary Examiner—G. Tolin
(74) Attorney, Agent, or Firm—Charles C. H. Wu; Wu & Cheung, LLP

(57) ABSTRACT

A heat dissipation apparatus, suitable for use to direct the heat generated from an electric appliance that has a circuit board, on which several electronic devices (heat sources) are formed. The heat dissipation apparatus has a main heat sink and several connecting heat sinks. The main heat sink is mounted on each electronic device, while the connecting heat sinks are disposed between the electronic devices and the main heat sink, allowing the heat generated from each electronic device to be conducted to the main heat sink. The heat dissipation apparatus is assembled in various kinds of electric appliances such as power supply or other electric products.

8 Claims, 4 Drawing Sheets

# HEAT DISSIPATION APPARATUS AND ELECTRIC APPLIANCE USING THE SAME

CROSS-REFERENCE TO RELATED APPLICATION

This application claims the priority benefit of Taiwan application serial no. 91212992, filed Aug. 21, 2002:

BACKGROUND OF THE INVENTION

1. Field of the Invention

The invention relates in general to a heat dissipation apparatus, and more particularly, to a heat dissipation apparatus having a main heat sink and at least one connecting heat sink. The assembly of the heat dissipation apparatus and the electric appliance is convenient, and rework can be performed on individual electronic device.

2. Related Art of the Invention

The power supply bas become an inevitable product of the prosperous computer industry. The commonly seen power supply is employed in a host of desktop computers. In addition to the lower-power power supply used in the computer, the high-power power supply for the high-level product is also under development. The heat dissipation design is particularly crucial for the power supply with high power output. In addition to the heat dissipation performance, the assembling convenience to an electric appliance and reworking of the assembly directly reflect on the cost and assemble labor consumption. Here, the process of reworking means an action that when a malfunction or other issue has been found for the device after being assembled, the device is then replaced or modified.

FIGS. 1A and 1B show a conventional assembly of a heat dissipation apparatus and an electric appliance. As shown in FIGS. 1A and 1B, the electric appliance with the heat dissipation apparatus includes an electric product 100, a heat sink 104 and several connecting members 108. The electric product 100 has a circuit board 102, on which at least one electronic device 106 is disposed The electronic devices 106 are the major heat generating sources. The heat generated from the electronic devices 106 is directed and dissipated by the heat sink 104, such that the normal operation of the electric product 100 can be maintained.

Further referring to FIGS. 1A and 1B, while assembling the electric product 100 and the heat sink 104, each of the electronic devices 106 is fixed on the heat sink 104 via one of the connecting members 108. The connecting members 108 typically include screws 108a and nuts 108b. After the electronic devices 106 and the heat sink 104 are installed, the heat sink 104 including the electronic devices 106 is then installed in the electric product 100. Such installation causes the following problems.

(1) If location error occurs to the electronic devices on the heat sink, part of the electronic devices, after the electronic devices and the circuit board are coupled, a portion of the electronic devices, due to the error of misalignment, will be damaged. Particularly, the leading pins will be damaged and then reliability or lifetime of the product will be reduced (2) While performing reworking, all the electronic devices have to be removed from the heat sink, followed by reinstallation. However, such rework cannot completely resolve the misalignment Also and, the electronic devices, which can normally work, has possibility to be damaged during the second assembling process.

(3) As at least one electronic device is fixed on the heat sink, the electronic device has to be aligned with proper locations of the circuit board in order to perform assembly. The assembly is thus very time consuming.

SUMMARY OF THE INVENTION

The present invention provides a heat dissipation apparatus which can be installed in an electric product easily. When reworking is performed on individual electronic devices, such as replacing the device with a new one, the reworking is not necessary to be applied to the whole assembly.

The heat dissipation apparatus can be applied to dissipate heat generated by an electric product. The electric product includes a circuit board, on which at least one electronic device (heat generating sources) is formed. The heat dissipation apparatus includes a main heat sink and at least one connecting heat sink. The main heat sink is mounted on each electronic device of the circuit board, and the connecting heat sink is disposed between the electronic device and the main heat sink, such that the heat of the electronic device can be conducted to the main heat sink via the connecting heat sink.

The heat dissipation apparatus further comprises at least one connecting member connecting between the main heat sink and the connecting heat sink. The connecting member comprises screws and nuts. In addition, the connecting member includes heat conductive glue.

In the present invention, the electric product includes a power supply or other electric appliance. In addition, the electronic device of the power supply includes a chip or other active devices (heat generating sources).

BRIEF DESCRIPTION OF THE DRAWINGS

These, as well as other features of the present invention, will become more apparent upon reference to the drawings wherein.

DETAILED DESCRIPTION OF THE PREFERRED EMBODIMENT

Figure 1A:
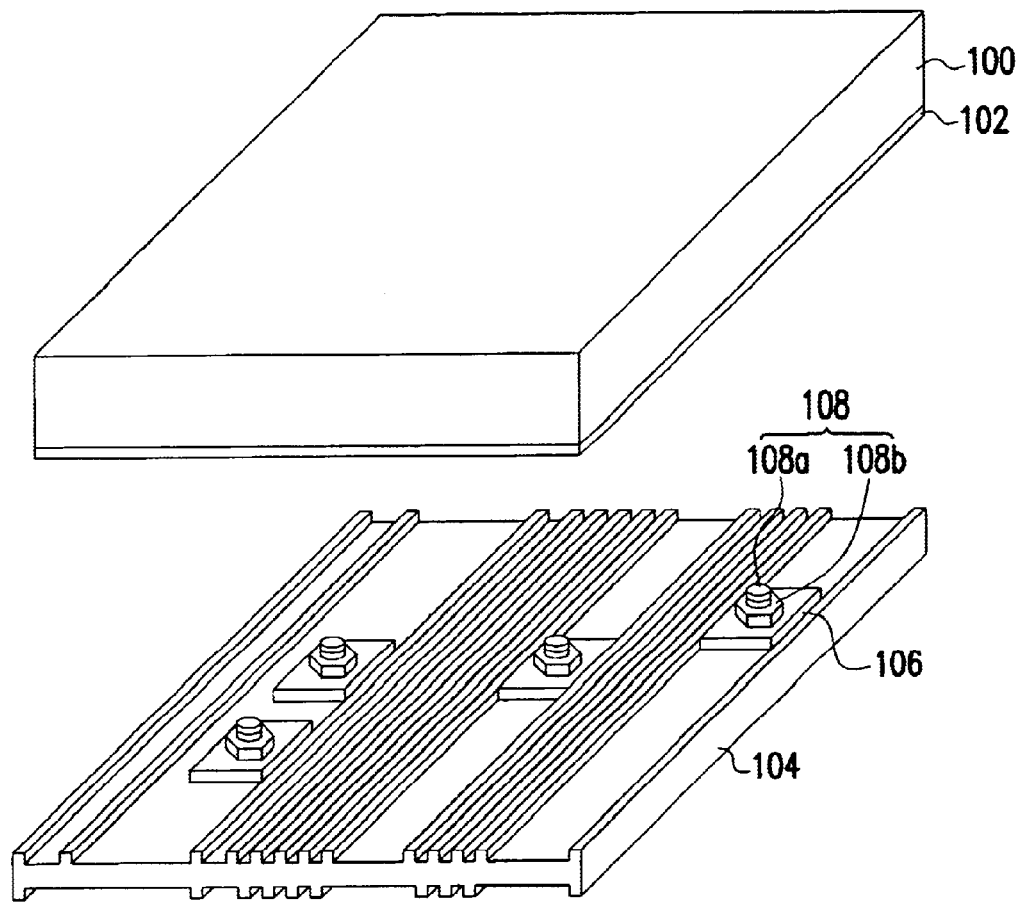
FIGS. 1A–1B show a conventional assembly of a heat dissipation apparatus and an electric product.
Figure 1B:
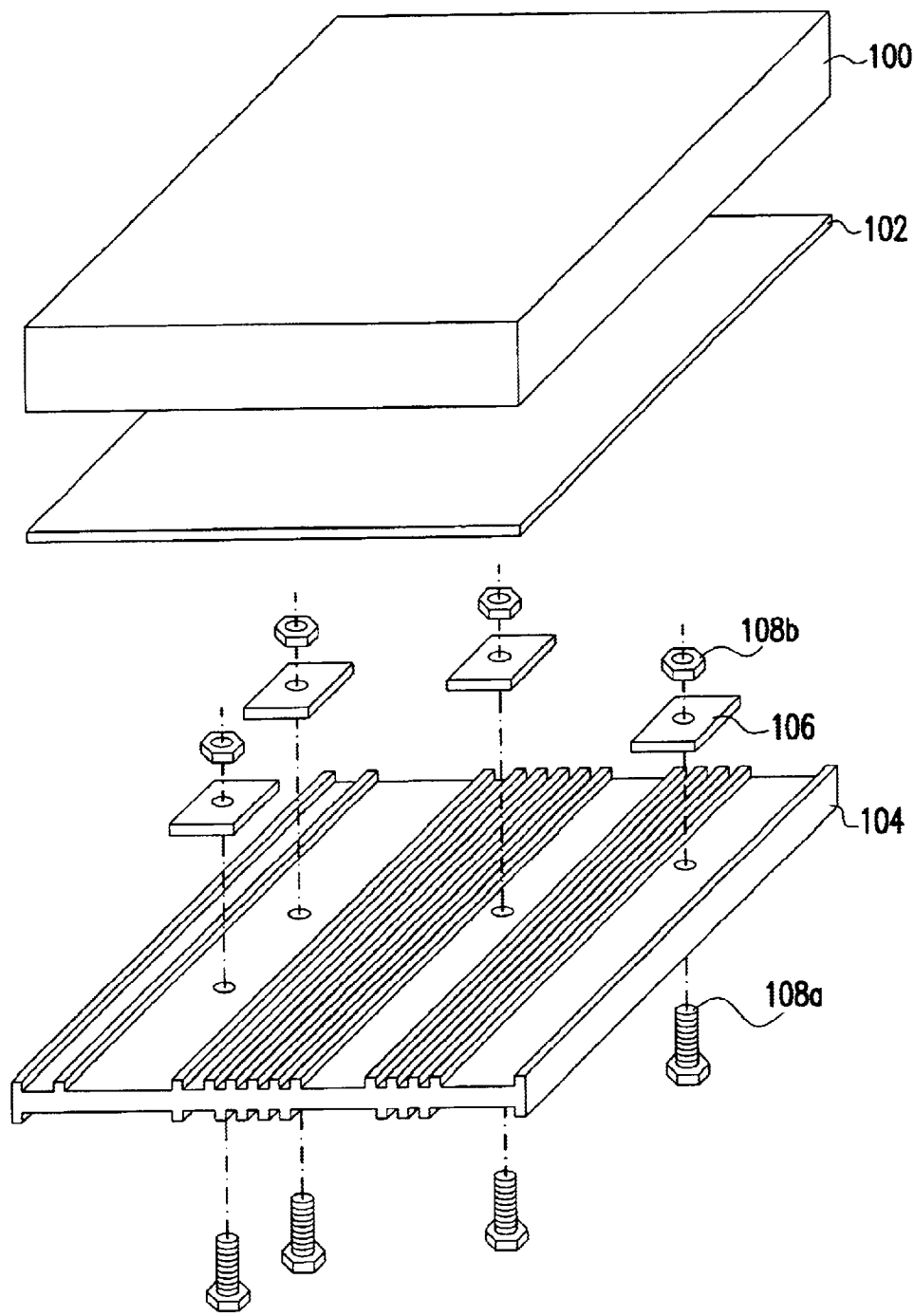
Figure 2A:
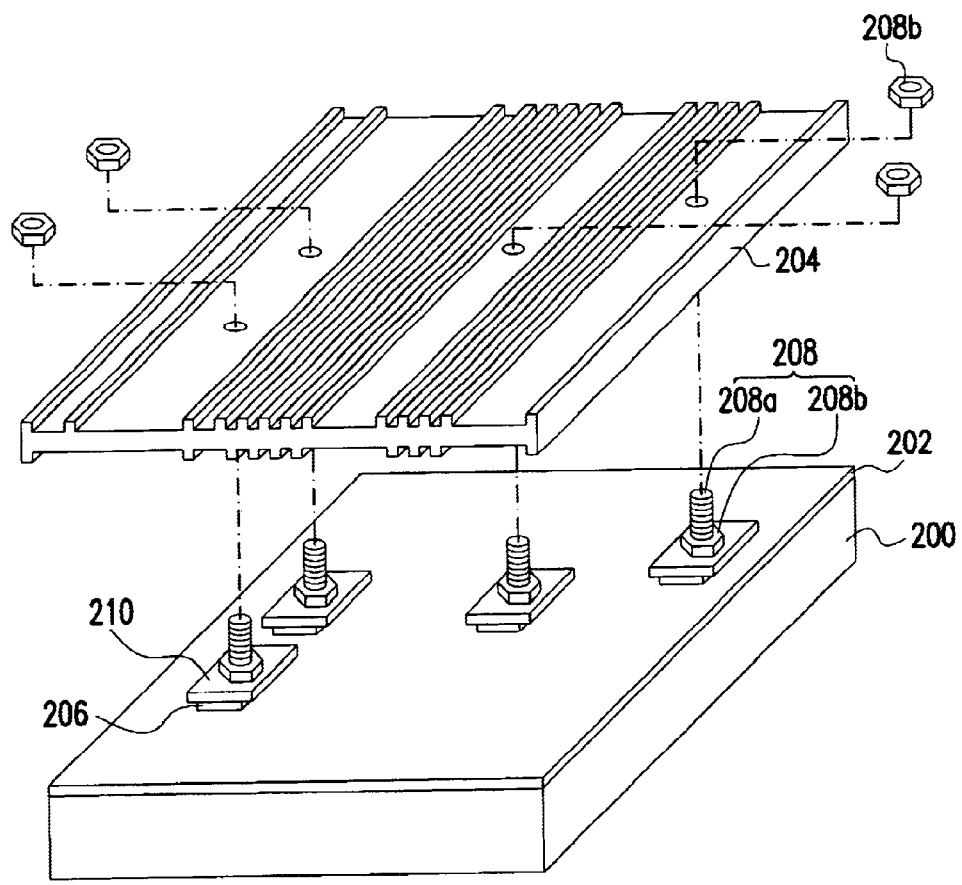
FIGS. 2A–2B show the assembly of a heat dissipation apparatus and an electric product according to the present invention.
Figure 2B:
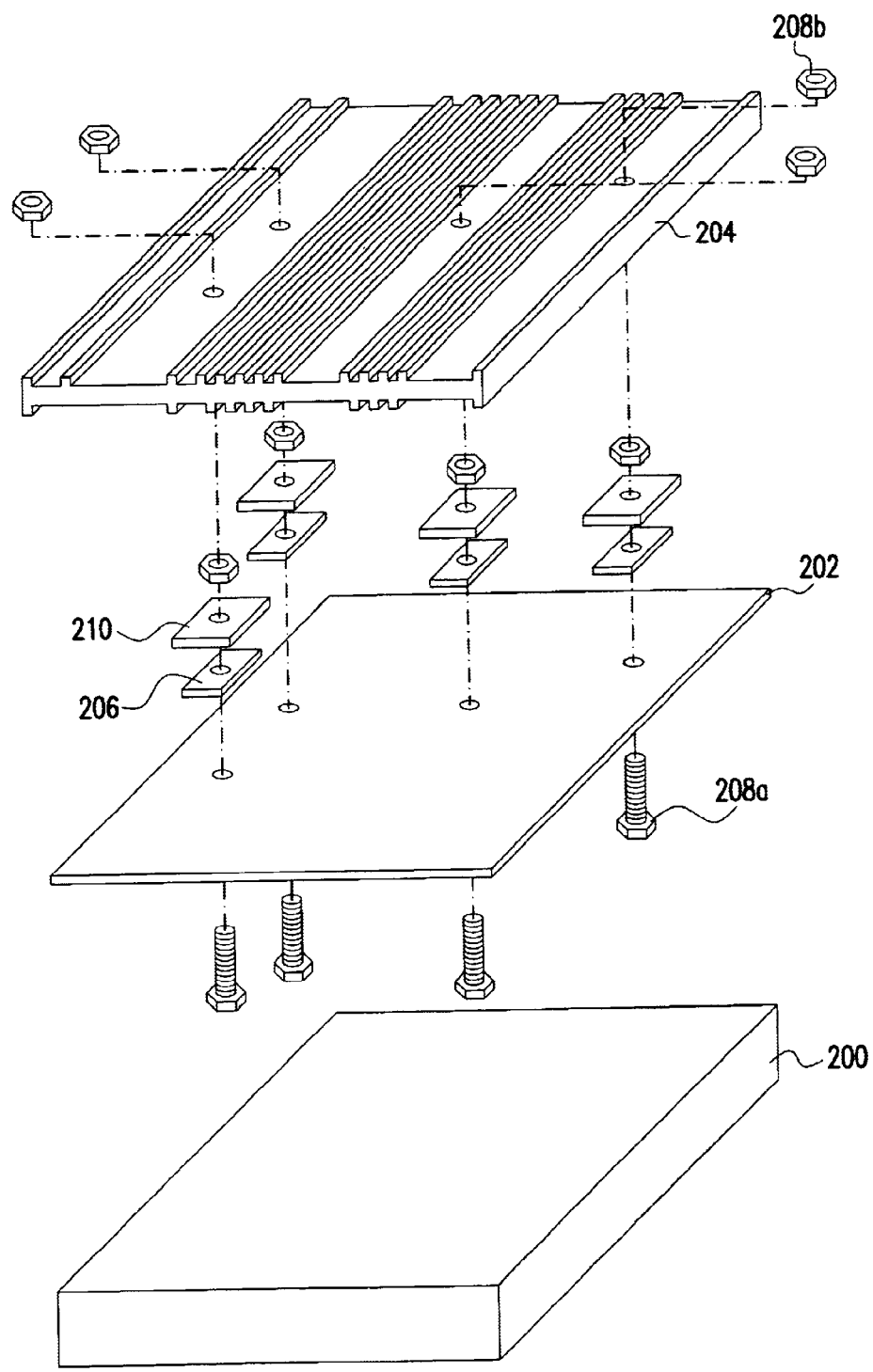

FIGS. 2A and 2B show a schematic drawing of the assembly of a heat dissipation apparatus and an electric appliance according to one embodiment of the present invention. The electric appliance assembled with the heat dissipation apparatus includes an electric product 200, a main heat sink 204, at least one connecting heat sink 210, and at least one connecting member 208. According to a preferred embodiment, the connecting member 208 passes through the connecting heat sink 210 and the main heat sink 204. In the embodiment, a plurality of connecting heat sinks 210 and a plurality of connecting member 208 are preferably taken as an example. The electric product 200 includes a circuit board 202, on which at least one electronic device 206 is formed. The connecting member 208 passes through the electronic device 206, the connecting heat sink 210 and the main heat sink 204 for connecting and fixing the electronic device 206, the connecting heat sink 210 and the main heat sink 204 together. The misalignment of the electronic device 206, the connecting heat sink 210 and the main heat sink 204 can be effectively resolved. A plurality of electronic devices 206 is taken as an example. The electronic devices 206 normally generate heat while operating. The heat generated by the electronic devices 206 is dissipated by the connecting heat sinks 210 that is mounted on the electronic devices 206 and the main heat sink 204, allowing the electric product to operate normally.

Referring to FIGS. 2A and 2B, before assembling the electric product 200 and the heat sink 204, the connecting heat sink 210 is mounted on the corresponding electronic device 206. The connecting heat sinks 210 are then aligned and assembled into the circuit board 202 at proper positions. After the active devices 206 are assembled on the circuit board 202, the main heat sink 204 is installed such that the main heat sink 204 connects with the connecting heat sink 210 through the connecting member 208 as shown in FIGS. 2A and 2B. The connections between the above electronic devices 206, the connecting heat sinks 210 and the main heat sink 204 are performed by passing the connecting members 208 through the electronic device 206, the connecting heat sink 210 and the main heat sink 204. The connecting members 208 include combination of screws 208a and nuts 208b, for example. In addition, the connecting members 208 may also be heat conductive glue and adhesive heat conducting glue.

After installation of the electronic devices 206, the connecting heat sinks 210 and the main heat sink 204, electric testing can be performed on each electronic device 206 on the circuit board 202 to ensure normal operation of each electronic device 206. If abnormality occurs in the electric testing step, the main heat sink 204, the network can be performed on the abnormal electronic device 206 for fixing the abnormality. Therefore, the time consumed for rework is greatly reduced. Also and, the product reliability can be further improved.

According to the above, the heat dissipation apparatus provided by the present invention includes at least the following advantages.

1. The diversion of the connecting heat sinks in the heat dissipation apparatus provided by the present invention eliminates the requirement for directly mounting the electronic devices to the main heat sink, such that the problems arisen from assembly alignment are resolved.

2. If reworking of the heat dissipation apparatus is required, by removing the main heat sink, the reworking can be performed on the abnormal electronic device only, such that the time consumed by reworking is greatly reduced.

Other embodiments of the invention will appear to those skilled in the art from consideration of the specification and practice of the invention disclosed herein. It is intended that the specification and examples be considered as exemplary only, with a true scope and spirit of the invention being indicated by the following claims.

What is claimed is:

1. A heat dissipation apparatus, suitable for dissipating heat generated from an electric appliance, the electric appliance comprising a circuit board having a plurality of electronic devices thereon, the heat dissipation apparatus comprising:

a main heat sink, mounted on said electronic devices;

at least one connecting heat sink, disposed on each of said electronic devices, wherein said connecting heat sink is disposed between the main heat sink and the electronic device; and at least one connecting member, connecting said electronic device, said connecting heat sink and said main heat sink for connecting and fixing said electronic device, said connecting heat sink and said main heat sink together.

2. The heat dissipation apparatus according to claim 1, wherein said connecting members further comprise a combination of screw and a nut.

3. The heat dissipation apparatus according to claim 1, wherein said connecting member further comprises a heat conductive glue.

4. The heat dissipation apparatus according to claim 1, wherein the electronic device further comprises a chip.

5. An electric appliance having a heat dissipation, comprising:

a circuit board having a plurality of electronic devices thereon;

a main heat sink, mounted on said electronic devices;

at least one connecting heat sink, disposed on each of said devices between the main heat sink and the electronic device; and at least one connecting member, connecting said electronic device, said connecting heat sink and said main heat sink for connecting and fixing said electronic device, said connecting heat sink and said main heat sink together.

6. The heat dissipation apparatus according to claim 5, wherein said connecting members further comprise a combination of screw and a nut.

7. The heat dissipation apparatus according to claim 5, wherein the connecting members further comprise a heat conductive glue.

8. The heat dissipation apparatus according to claim 5, wherein the electronic device further comprises a chip.

* * * * *